United States Patent
Tanaka et al.

(10) Patent No.: US 7,664,365 B2
(45) Date of Patent: Feb. 16, 2010

(54) BEAM HOMOGENIZER, AND LASER IRRADIATION METHOD, LASER IRRADIATION APPARATUS, AND LASER ANNEALING METHOD OF NON-SINGLE CRYSTALLINE SEMICONDUCTOR FILM USING THE SAME

(75) Inventors: Koichiro Tanaka, Isehara (JP); Takatsugu Omata, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 363 days.

(21) Appl. No.: 11/664,054

(22) PCT Filed: Oct. 18, 2005

(86) PCT No.: PCT/JP2005/019447

§ 371 (c)(1),
(2), (4) Date: Mar. 29, 2007

(87) PCT Pub. No.: WO2006/046495

PCT Pub. Date: May 4, 2006

(65) Prior Publication Data

US 2008/0280425 A1    Nov. 13, 2008

(30) Foreign Application Priority Data

Oct. 27, 2004    (JP)    .............................. 2004-311919

(51) Int. Cl.
*G02B 6/00*    (2006.01)
*H01L 21/20*    (2006.01)
*G02B 6/10*    (2006.01)
*H01S 3/10*    (2006.01)

(52) U.S. Cl. ......................... 385/147; 385/146; 385/14; 438/487; 372/9; 257/E21.09

(58) Field of Classification Search .................. 385/14, 385/15, 18, 31, 39, 133, 147, 146, 901; 359/619, 359/623, 626; 257/E21.09; 372/9; 438/487
See application file for complete search history.

(56) References Cited

U.S. PATENT DOCUMENTS 4,733,944 A    3/1988    Fahlen et al.

(Continued)

FOREIGN PATENT DOCUMENTS

EP    0 805 368    11/1997

(Continued)

OTHER PUBLICATIONS

International Search Report (Application No. PCT/JP2005/019447) dated Jan. 17, 2006.

(Continued)

*Primary Examiner*—Brian M Healy
(74) *Attorney, Agent, or Firm*—Eric J. Robinson; Robinson Intellectual Property Law Office, P.C.

(57) ABSTRACT

A rectangular beam having the energy density distribution homogenized in its short-side direction is formed in a beam homogenizer wherein two light reflection surfaces are parallel-provided in a beam progression optical waveguide with a predetermined space so as to face each other at surfaces along the beam progression direction and a course change reflection surface for changing the beam progression direction is formed at a surface in the direction intersected with the light reflection surfaces. The beam enters a cylindrical lens array and a cylindrical lens sequentially to homogenize the energy density distribution in its long-side direction. Then, the irradiation laser from the cylindrical lens is projected onto a non-single crystalline semiconductor film to perform annealing.

52 Claims, 10 Drawing Sheets

U.S. PATENT DOCUMENTS

| | | | |
|---|---|---|---|
| 4,744,615 A | 5/1988 | Fan et al. |
| 4,793,694 A | 12/1988 | Liu |
| 4,830,447 A | 5/1989 | Kamiyama et al. |
| 5,080,474 A | 1/1992 | Miyamoto |
| 5,224,200 A | 6/1993 | Rasmussen et al. |
| 5,285,509 A | 2/1994 | Reeder et al. |
| 5,303,084 A | 4/1994 | Pflibsen et al. |
| 5,825,551 A | 10/1998 | Clarkson et al. |
| 5,886,313 A | 3/1999 | Krause et al. |
| 5,900,980 A | 5/1999 | Yamazaki et al. |
| 6,002,523 A | 12/1999 | Tanaka |
| 6,038,075 A | 3/2000 | Yamazaki et al. |
| 6,078,652 A | 6/2000 | Barak |
| 6,104,535 A | 8/2000 | Tanaka |
| 6,137,633 A | 10/2000 | Tanaka |
| 6,157,492 A | 12/2000 | Yamazaki et al. |
| 6,176,926 B1 | 1/2001 | Tanaka |
| 6,212,012 B1 | 4/2001 | Tanaka |
| 6,215,595 B1 | 4/2001 | Yamazaki et al. |
| 6,219,476 B1 * | 4/2001 | Kususawa et al. ............ 385/33 |
| 6,236,449 B1 | 5/2001 | Tanitsu |
| 6,239,913 B1 | 5/2001 | Tanaka |
| 6,285,443 B1 | 9/2001 | Wangler et al. |
| 6,291,320 B1 | 9/2001 | Yamazaki et al. |
| 6,300,176 B1 | 10/2001 | Zhang et al. |
| 6,304,385 B1 | 10/2001 | Tanaka |
| 6,310,727 B1 | 10/2001 | Tanaka |
| 6,341,042 B1 * | 1/2002 | Matsunaka et al. ......... 359/618 |
| 6,388,812 B2 | 5/2002 | Yamazaki et al. |
| 6,393,042 B1 | 5/2002 | Tanaka |
| 6,437,284 B1 | 8/2002 | Okamoto et al. |
| 6,437,313 B2 | 8/2002 | Yamazaki et al. |
| 6,441,965 B2 | 8/2002 | Yamazaki et al. |
| 6,563,843 B1 | 5/2003 | Tanaka |
| 6,573,162 B2 | 6/2003 | Tanaka et al. |
| 6,689,651 B2 | 2/2004 | Zhang et al. |
| 6,693,257 B1 | 2/2004 | Tanaka |
| 6,738,396 B2 | 5/2004 | Filgas et al. |
| 6,750,424 B2 | 6/2004 | Tanaka |
| 6,785,304 B2 | 8/2004 | Filgas |
| 6,819,490 B2 * | 11/2004 | Sandstrom et al. .......... 359/566 |
| 6,856,630 B2 | 2/2005 | Tanaka |
| 6,856,727 B2 | 2/2005 | Li |
| 2001/0010702 A1 | 8/2001 | Tanaka |
| 2002/0003666 A1 | 1/2002 | Yamazaki et al. |
| 2002/0146873 A1 | 10/2002 | Tanaka |
| 2002/0153360 A1 | 10/2002 | Yamazaki et al. |
| 2002/0196419 A1 | 12/2002 | Mizouchi |
| 2002/0196551 A1 | 12/2002 | Yamazaki et al. |
| 2003/0024905 A1 | 2/2003 | Tanaka |
| 2003/0061984 A1 | 4/2003 | Maekawa et al. |
| 2003/0068836 A1 | 4/2003 | Hongo et al. |
| 2003/0203549 A1 | 10/2003 | Yamazaki et al. |
| 2004/0058553 A1 | 3/2004 | Tanaka |
| 2004/0179807 A1 | 9/2004 | Tanaka |
| 2004/0213514 A1 | 10/2004 | Tanaka et al. |
| 2005/0031261 A1 | 2/2005 | Tanaka |
| 2005/0079645 A1 | 4/2005 | Moriwaka |
| 2005/0092937 A1 | 5/2005 | Tanaka |
| 2005/0111105 A1 | 5/2005 | Tanaka |
| 2006/0072877 A1 | 4/2006 | Tanaka et al. |
| 2008/0280425 A1 * | 11/2008 | Tanaka et al. ................ 438/487 |

FOREIGN PATENT DOCUMENTS

| | | |
|---|---|---|
| EP | 1 400 832 | 3/2004 |
| GB | 2 044 948 | 10/1980 |
| JP | 08-338962 | 12/1996 |
| JP | 09-214069 | 8/1997 |
| JP | 10-021718 | 1/1998 |
| JP | 2002-184206 | 6/2002 |
| JP | 2003-218054 | 7/2003 |
| JP | 2004-134785 | 4/2004 |

OTHER PUBLICATIONS

Written Opinion (Application No. PCT/JP2005/019447) dated Jan. 17, 2006.

* cited by examiner

FIG. 6A top view
FIG. 6B side view
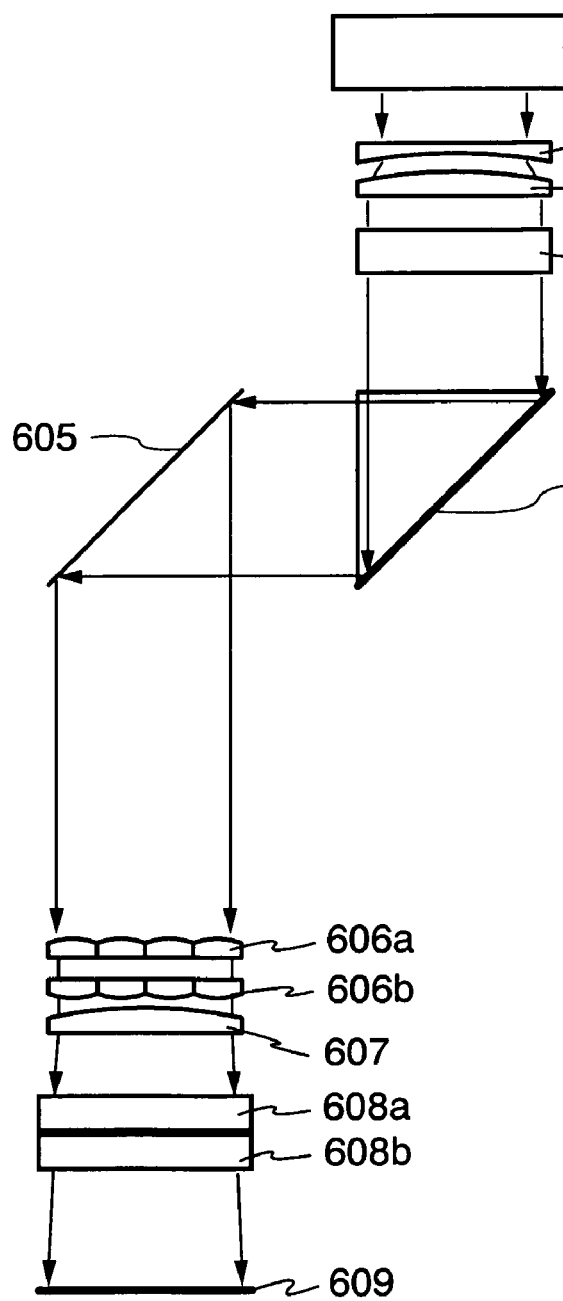
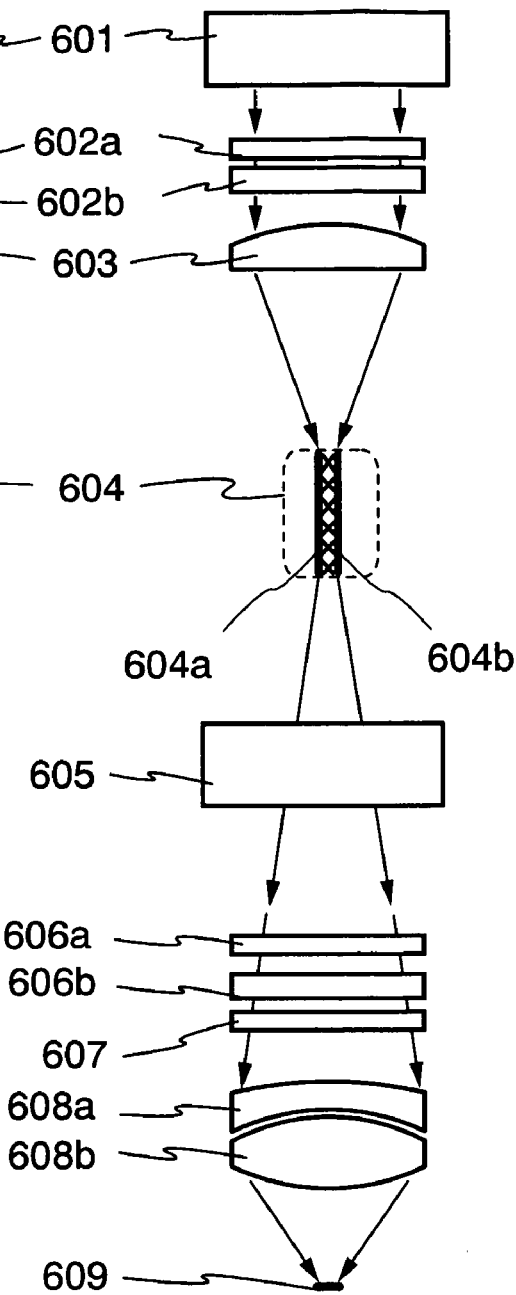

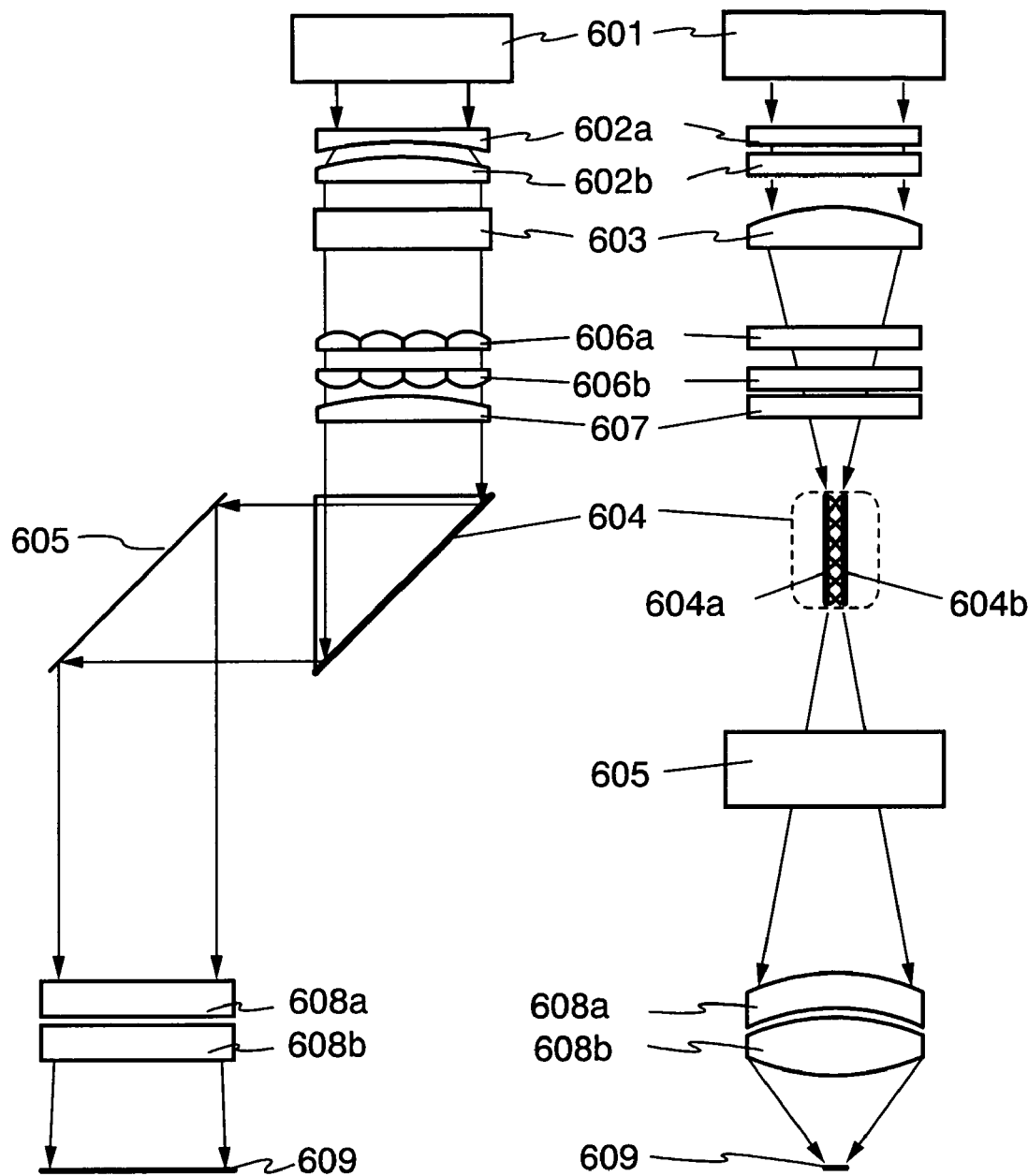
FIG. 7A top view    FIG. 7B side view

BEAM HOMOGENIZER, AND LASER IRRADIATION METHOD, LASER IRRADIATION APPARATUS, AND LASER ANNEALING METHOD OF NON-SINGLE CRYSTALLINE SEMICONDUCTOR FILM USING THE SAME

TECHNICAL FIELD

The present invention relates to a beam homogenizer for homogenizing irradiation energy density distribution of a laser beam, a laser irradiation method and a laser irradiation apparatus using the beam homogenizer, and a laser annealing method of a non-single crystalline semiconductor film using the beam homogenizer.

Specifically, the present invention relates to a beam homogenizer for homogenizing irradiation energy density distribution of a laser beam by which enlargement of the apparatus area and increase of the apparatus weight and the material cost can be prevented, a laser irradiation method and a laser irradiation apparatus using the beam homogenizer, and a laser annealing method of a non-single crystalline semiconductor film using the beam homogenizer.

BACKGROUND ART

In recent years, there has been a technique widely researched for crystallizing or enhancing the crystallinity of an amorphous semiconductor film or a crystalline semiconductor film (a semiconductor film having the crystallinity such as poly-crystal or micro-crystal, except a single-crystal), namely, a crystalline semiconductor film which is not single-crystal (hereinafter referred to as a non-single crystalline semiconductor film), formed over an insulating substrate such as glass with laser annealing performed thereto.

For the laser annealing, a pulsed laser oscillator whose output is high such as an excimer laser may be used for example, and it is possible to shape the laser beam into a square spot with several cm on a side or into a linear spot with 10 cm or more in length by an optical system, and besides, the beam spot can irradiate while being moved relative to the irradiation surface to perform the laser annealing. Such a method can enhance the productivity and is industrially superior, and thus it is preferably employed for the actual laser annealing.

In particular, when the linear beam spot is employed, unlike a punctate beam spot requiring to be scanned from front to back and from side to side, the linear beam spot can provide high productivity since an entire surface can be irradiated by scanning the linear beam spot only in a direction perpendicular to the direction of its major axis.

Because of such high productivity, the laser annealing process at present mainly employs the linear beam spot obtained by shaping a beam spot of a pulsed excimer laser with an appropriate optical system.

It is to be noted here that the linear beam spot means a rectangular or elliptical beam spot having a high aspect ratio.

The scan is performed in the direction perpendicular to the direction of the major axis of the linear beam spot because it is the most effective scanning direction.

In order to shape a cross-section of the bean spot into a linear shape on the irradiation surface, an optical system using a cylindrical lens array or the like is generally used in many cases.

The optical system, in addition, not only shapes the cross-section of the beam spot into a linear shape but also homogenizes the energy density distribution of the beam spot on the irradiation surface.

Generally, the optical system for homogenizing the energy density distribution of the laser beam is referred to as a beam homogenizer.

For a beam homogenizer for providing the linear beam spot, a beam progression optical waveguide which is generally referred to as a light pipe may be used (see Patent Document 1), as well as the above-described cylindrical lens array.

This beam progression optical waveguide may be formed in a shape of circular cone, pyramid, column, prism, or the like, and transmits light from one end to the other end by reflection.

[Patent Document 1]
Japanese Patent Laid-Open No. 2004-134785

Two light reflection surfaces are formed in parallel so as to face each other at surfaces along the direction of the beam progression in the beam progression optical waveguide in order to homogenize the energy density distribution of the beam spot in the direction of its minor axis. Thus, a laser beam enters the beam progression optical waveguide from its entrance, and the laser beam is reflected repeatedly on the two light reflection surfaces and is led to its exit.

In other words, the laser beam entered the beam progression optical waveguide is superposed at the exit so as to be folded.

Consequently, the energy density distribution of the laser beams is homogenized at the exit.

The shape of a cross-section of the laser beam emitted from the beam progression optical waveguide depends on the shape of the exit thereof.

Therefore, in the case of obtaining a beam spot whose cross-section has a linear shape, the exit has preferably a linear shape.

FIG. 2A shows a reflective-type beam progression optical waveguide 201, which is a typical example of a conventional beam homogenizer.

In addition, FIG. 2B is a plane schematic diagram showing a light path of a laser beam in the case of using the beam progression optical waveguide 201. A laser beam 202 enters from an entrance 203, the energy density distribution of the laser beam 202 is homogenized by the beam progression optical waveguide, and then the homogenized laser beam is emitted from an exit 204 in FIG. 2B.

DISCLOSURE OF INVENTION

At that time, the more homogenized the energy density distribution of the linear beam spot is, the more homogeneously the laser annealing can be performed, and thus a higher-quality semiconductor device can be provided.

In addition, the longer the length of the linear beam spot can be, the higher the productivity of the apparatus can be.

In order to perform such a more homogeneous laser annealing with higher productivity as described above, a beam homogenizer using a larger beam progression optical waveguide 201 is required for example.

Accordingly, there are problems in that the occupied area of the apparatus is increased, the apparatus weight is increased, and the material cost is increased.

The present inventor succeeded in the development by making efforts to overcome the foregoing problems.

Therefore, it is an object of the present invention to prevent the foregoing problems, and specifically, to reduce the weight, the size, and the material cost of a beam homogenizer having a beam progression optical waveguide.

In addition, it is an object of the invention to provide a laser irradiation method and a laser irradiation apparatus, and a laser annealing method of a non-single crystalline semiconductor film which exhibit high productivity and can form a more homogenous semiconductor film by using the above-described beam homogenizer.

According to the invention, a beam homogenizer having a beam progression optical waveguide which reduces its weight, size, and material cost as described above, and a laser irradiation method, a laser irradiation apparatus, and a laser annealing method of a non-single crystalline semiconductor film which exhibit high productivity and can form a more homogenous semiconductor film by using the beam homogenizer are provided.

In the beam homogenizer of the invention, a beam progression optical waveguide is formed by two light reflection surfaces provided in parallel with a predetermined space so as to face each other at surfaces along the direction of the beam progression, and a course change reflection surface for changing the progression direction of the beam is formed at a surface in the direction intersected with the light reflection surfaces.

In the above-described structure, the beam homogenizer has one or a plurality of course change reflection surfaces, and a part or all of the course change reflection surfaces can be used to change the progression direction of the beam. The larger the number of the course change reflection surfaces used for changing the progression direction of the beam is, the smaller the size of the beam progression optical waveguide can be.

As for a specific structure of the beam homogenizer, it is preferable that the shape of the light reflection surface of the beam progression optical waveguide be a right triangle, the course change reflection surface be formed at a hypotenuse thereof, and an entrance and an exit be formed at the two sides other than the hypotenuse respectively.

Alternatively, the structure may be as follows: the shape of the light reflection surface of the beam progression optical waveguide is a pentagon and an entrance and an exit are formed at adjacent sides respectively, and besides, two course change reflection surfaces may be formed at two sides adjacent to the two sides of the entrance and the exit respectively, or three course change reflection surfaces may be formed at all the sides other than the two sides of the entrance and the exit respectively.

Subsequently, the laser irradiation method and the laser irradiation apparatus have the following features.

According to the laser irradiation method, a laser beam enters a beam homogenizer in which two light reflection surfaces are provided in a beam progression optical waveguide in parallel with a predetermined space so as to face each other at surfaces along the progression direction of the beam and a course change reflection surface for changing the progression direction of the beam is formed at a surface in the direction intersected with the light reflection surfaces, thereby a laser beam having the energy density distribution homogenized in the direction of its short side is formed. The homogenized laser beam passes through a cylindrical lens array and a cylindrical lens sequentially to form an irradiation beam having the energy density distribution homogenized in the direction of its long side as well. Then, an irradiation surface is irradiated with the irradiation beam. The irradiation surface is preferably a non-single crystalline semiconductor film over a substrate.

According to the laser irradiation apparatus, a beam homogenizer in which two light reflection surfaces are provided in a beam progression optical waveguide in parallel with a predetermined space so as to face each other at surfaces along the progression direction of the beam and in which a course change reflection surface for changing the progression direction of the beam is formed at a surface in the direction intersected with the light reflection surfaces, for forming a beam having the energy density distribution homogenized in the direction of its short side, a cylindrical lens array and a cylindrical lens to which the beam is subsequently entered, for homogenizing the energy density distribution in the direction of its long side, and a stage for setting an irradiation surface onto which the irradiation beam having the energy density distribution homogenized in both directions of its long and short sides, which is ejected from the cylindrical lens array and the cylindrical lens, is projected are provided.

Furthermore, according to the annealing method of a non-single crystalline semiconductor film, a laser beam enters a beam homogenizer in which two light reflection surfaces are provided in a beam progression optical waveguide in parallel with a predetermined space so as to face each other at surfaces along the progression direction of the beam and a course change reflection surface for changing the progression direction of the beam is formed at a surface in the direction intersected with the light reflection surfaces, thereby a laser beam having the energy density distribution homogenized in the direction of its short side is formed. The laser beam passes through a cylindrical lens array and a cylindrical lens sequentially to form an irradiation beam having the energy density distribution homogenized in the direction of its long side as well. Then, a non-single crystalline semiconductor film over a substrate is irradiated with the irradiation beam.

It is to be noted that, according to the invention, a semiconductor device can also be manufactured using the above-described annealing method in the following way. A laser beam enters a beam homogenizer in which two light reflection surfaces are provided in a beam progression optical waveguide in parallel with a predetermined space so as to face each other at surfaces along the progression direction of the beam and a course change reflection surface for changing the progression direction of the beam is formed at a surface in the direction intersected with the light reflection surfaces, thereby a laser beam having the energy density distribution homogenized in the direction of its short side is formed. The laser beam passes through a cylindrical lens array and a cylindrical lens sequentially to form an irradiation beam having the energy density distribution homogenized in the direction of its long side as well. Then, a non-single crystalline semiconductor film over a substrate is irradiated with the irradiation beam to anneal the semiconductor film.

The invention has a beneficial effect in that the energy density distribution of a laser beam used for laser annealing is homogenized. In addition to this, by modifying a conventional beam progression optical waveguide (a light pipe), the economic efficiency can be achieved due to reduction in size, weight, and material cost of a beam homogenizer having a beam progression optical waveguide.

Since the occupied area of the beam homogenizer is decreased due to the reduction in its size, an optical system for crystallizing a non-single crystalline semiconductor film by laser annealing can be miniaturized.

In addition, a problem with processing accuracy of each component, which occurs when the size of the apparatus is increased in order to improve the mass productivity, can also be alleviated, and an apparatus exhibiting high accuracy can be manufactured.

Furthermore, transferring or moving the apparatus becomes easier due to the reduction in its weight, and the economic efficiency thereof can be increased as the material usage is decreased in accordance with the miniaturization of each component.

BRIEF DESCRIPTION OF DRAWINGS

FIGS. 6A and 6B are diagrams showing laser irradiation method and apparatus of the invention.

FIGS. 7A and 7B are diagrams showing a mode of the laser irradiation method and apparatus of the invention.

BEST MODE FOR CARRYING OUT THE INVENTION

Hereinafter, as for the invention, specifically a beam homogenizer, and a laser irradiation method, a laser irradiation apparatus, and an annealing method of a non-single crystalline semiconductor film using the beam homogenizer, embodiment modes including the best mode for carrying out the invention are described.

The beam homogenizer, and the laser irradiation method and the laser irradiation apparatus are described with reference to the drawings, and in particular, the beam homogenizer is described with a plurality of modes.

It is to be noted here that a method for manufacturing a semiconductor device using the annealing method of a non-single crystalline semiconductor film is also described according to the embodiment modes.

However, it is needless to say that the invention is not limited to the embodiment modes, and is construed according to description of claims.

Embodiment Modes of a Beam Homogenizer of the Invention

Various modes of a beam homogenizer are described with reference to FIGS. 1A, 1B, and FIGS. 3 to 5.

Figure 1A:
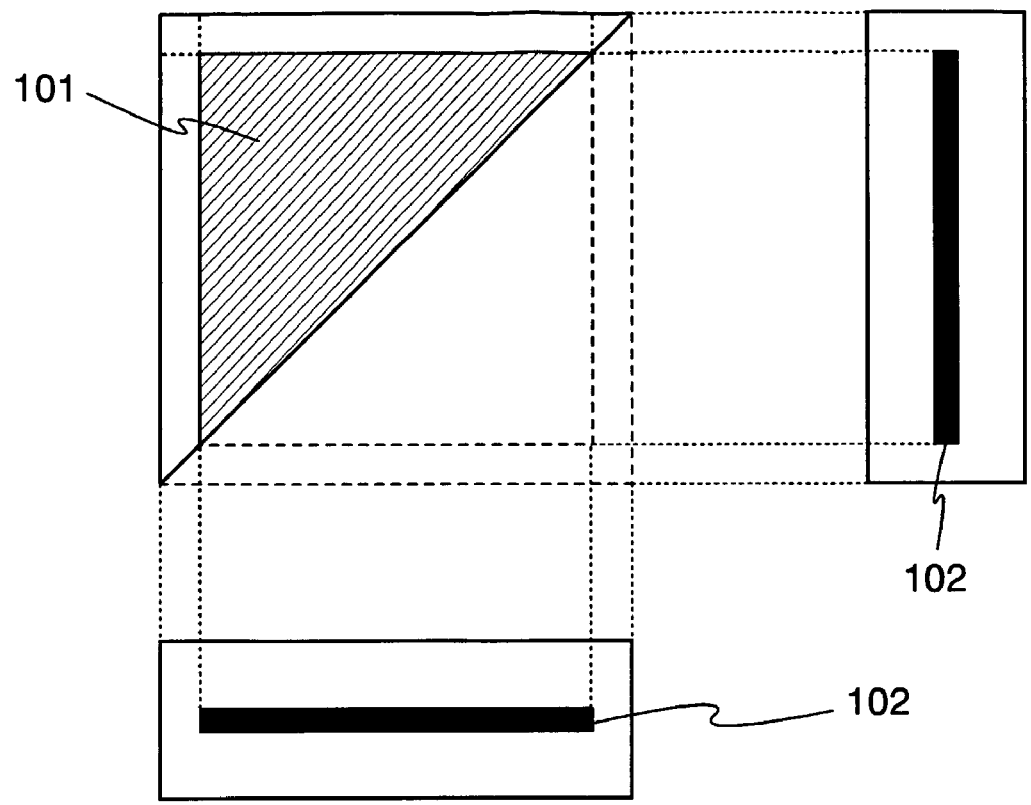
FIGS. 1A and 1B are diagrams showing a mode of a beam homogenizer of the invention.
Figure 1B:
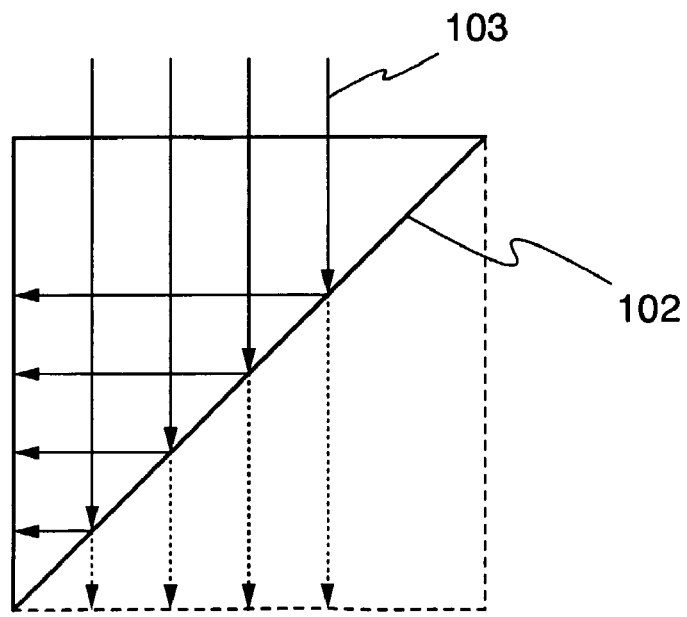
Figure 2A:
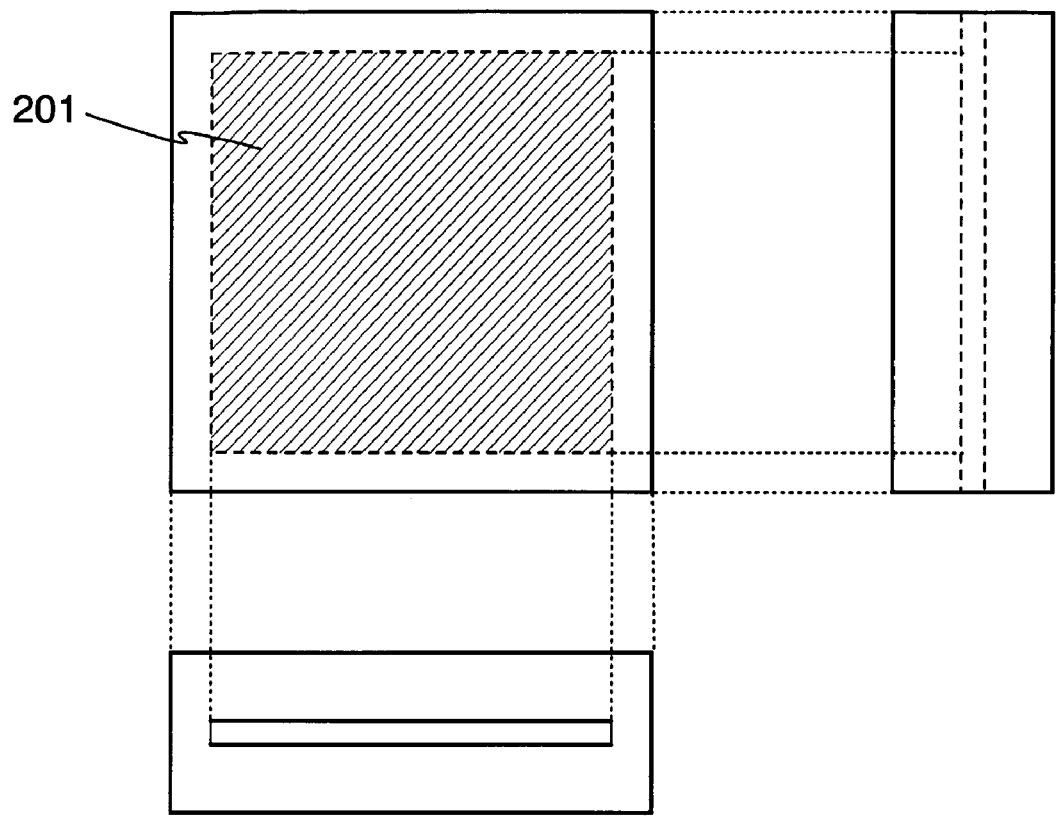
FIGS. 2A and 2B are diagrams showing a conventional beam progression optical waveguide and a light path of a laser beam using the same, respectively.
Figure 2B:
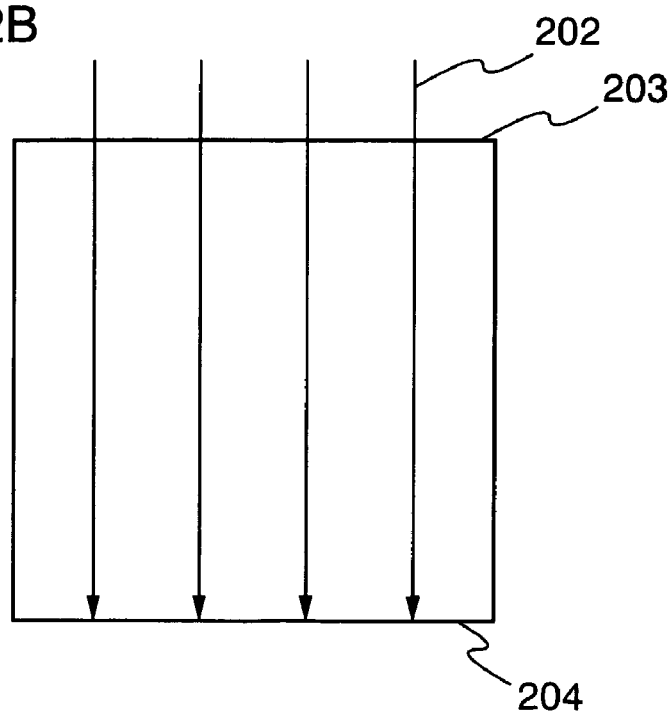

Respective beam homogenizers shown in FIGS. 1A, 1B, and FIGS. 3 to 5 are examples of various modes, in which a conventional beam progression optical waveguide 201 shown in FIG. 2A is modified to reduce the occupied area, the weight and the material cost of an apparatus.

First, FIG. 1A shows a schematic diagram of a beam progression optical waveguide 101 of the invention.

The beam progression optical waveguide 101 formed with two reflection surfaces provided in parallel so as to face each other shown in FIG. 1A is obtained by cutting the conventional rectangular optical waveguide shown in FIG. 2A along the diagonal line so as to be a right triangle and being provided with a course change reflection surface 102 at a surface in the direction intersected with the light reflection surfaces in the hypotenuse portion of the right triangle of the optical waveguide.

It is to be noted throughout this specification that this setting of the course change reflection surface is expressed by such description that merely "a course change reflection surface is formed in a side" such as "a course change reflection surface is formed in the hypotenuse" as described above in the invention.

FIG. 1B is a plane schematic diagram showing a light path of a laser beam of the beam progression optical waveguide 101.

Note that, according to the structure in FIG. 1B, a laser beam 103 is entered from the upper side in the drawing, reflected at the hypotenuse portion of the right triangle, namely at a reflection surface 102, and ejected to the left.

As shown in FIG. 1B, according to the invention, the distance of a laser beam from the entrance to the exit is equivalent to that of a laser beam from the entrance to the exit in a rectangular beam progression optical waveguide. Therefore, similarly in the rectangular beam progression optical waveguide, the intensity distribution of the laser beam is homogenized at the exit of the triangle beam progression optical waveguide 101.

By shaping the beam progression optical waveguide into a triangle as set forth above, the weight, the occupied area and the material cost thereof can be reduced by half.

Figure 3:
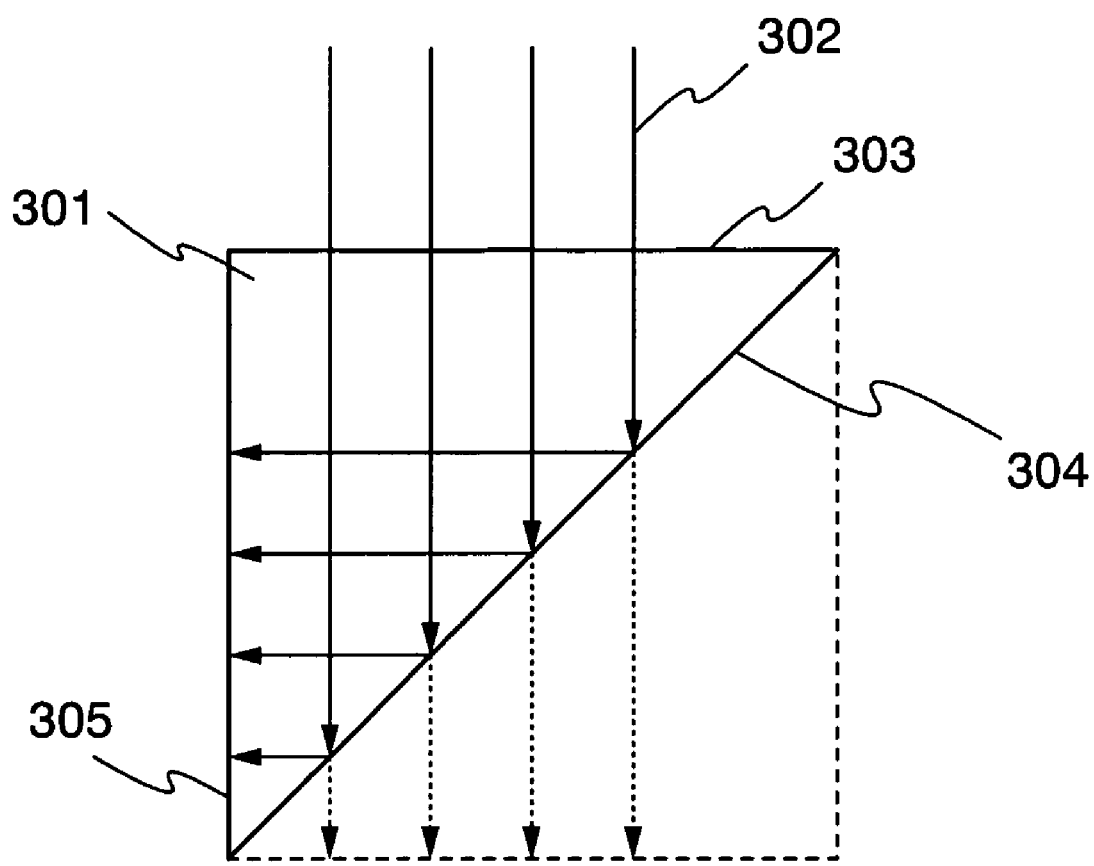
FIG. 3 is a diagram showing a structure of a beam progression optical waveguide in a beam homogenizer of the invention, particularly showing a position of a coating film.

Next, a structure of a beam progression optical waveguide of the invention, a manufacturing method and a function thereof are described in detail with reference to FIG. 3.

A beam progression optical waveguide 301 described here has a triangular shape similarly to the case of FIGS. 1A and 1B, in which a necessary coating film is arbitrarily provided for one light-transmissive plate such as a quartz glass plate.

That is, for a light-transmissive plate such as a quartz glass plate for forming the beam progression optical waveguide, a coating film 303 which transmits a laser beam is provided at a surface to which a laser beam 302 is entered, and a coating film 304 which reflects a laser beam is provided at a hypotenuse portion of the triangle.

Furthermore, a coating film 305 which transmits a laser beam is provided at a surface from which a laser beam is ejected.

Note that in this case, no coating film is required at a light reflection surface of the beam progression optical waveguide.

By forming such coating films, a laser beam can be reflected at the hypotenuse portion and the intensity distribution of the laser beam at the exit surface can be homogenized.

When the coating film which transmits a laser beam is formed at the entrance surface and the exit surface here, a dielectric multilayer film or the like can be used.

When the coating film which reflects a laser beam is formed for the course change reflection surface, an aluminum (Al) thin film, a chromium (Cr) thin film, a gold (Au) thin film, or a dielectric multilayer film can be used.

This beam progression optical waveguide has such a merit that a laser beam entered from the entrance surface can be totally reflected at the two light reflection surfaces provided in parallel so as to face each other within the light-transmissive plate.

It is to be noted that the total-reflection is performed at an interface between the outside and the inside within the light-transmissive plate.

Therefore, the entered laser beam progresses while being reflected to reach the course change reflection surface, and then the laser beam is reflected at that surface to change its progression direction. The laser beam further progresses and is ejected from the exit surface.

Accordingly, the optical transmittance of this beam progression optical waveguide can be drastically increased.

It is further preferable to enter a laser beam such that a condition for total reflection is also satisfied at the hypotenuse portion of the triangle of this beam progression optical waveguide.

Specifically, it is preferable that the total reflection condition be satisfied with an incidence angle of 45° by optimizing the refractive index of the light-transmissive plate in accordance with the wavelength of a laser beam used.

The two parallel light reflection surfaces can be formed by providing two mirrors so as to face each other or by forming the beam progression optical waveguide using a light-transmissive material.

More specifically, in the former, two mirrors are formed by forming a dielectric multilayer film or a film of mercury or the like on a plate of glass or the like, and the two mirrors are arranged in parallel with a predetermined space so as to face each other to form the beam progression optical waveguide.

In the latter, the beam progression optical waveguide is formed using a plate of quartz glass, sapphire, fluorite, BK7 (borosilicate glass), or the like which transmits light, has a uniform thickness, and a flat surface. The surface of a column becomes a light reflection surface in this case.

Total reflection at a light reflection surface is performed when a beam progressing inside the light-transmissive plate reaches an interface between the outside and the inside as set forth above. In order to generate the total reflection, it is not required to form a film such as a dielectric multilayer film on a surface of the light-transmissive plate unlike the case of using a mirror.

Note that these materials are different in the transmittance depending on the wavelength of a laser, and therefore the most suitable material may be appropriately selected depending on the wavelength of a laser used.

Next, modes of the beam homogenizer of the invention are described with reference to FIGS. 4A and 4B, each of which has a plurality of course change reflection surfaces.

Each drawing shows a beam progression optical waveguide in which a coating film which reflects a laser light to change the progression direction thereof is formed on a plurality of surfaces in a polygonal light-transmissive plate having a uniform thickness.

Figure 4A:
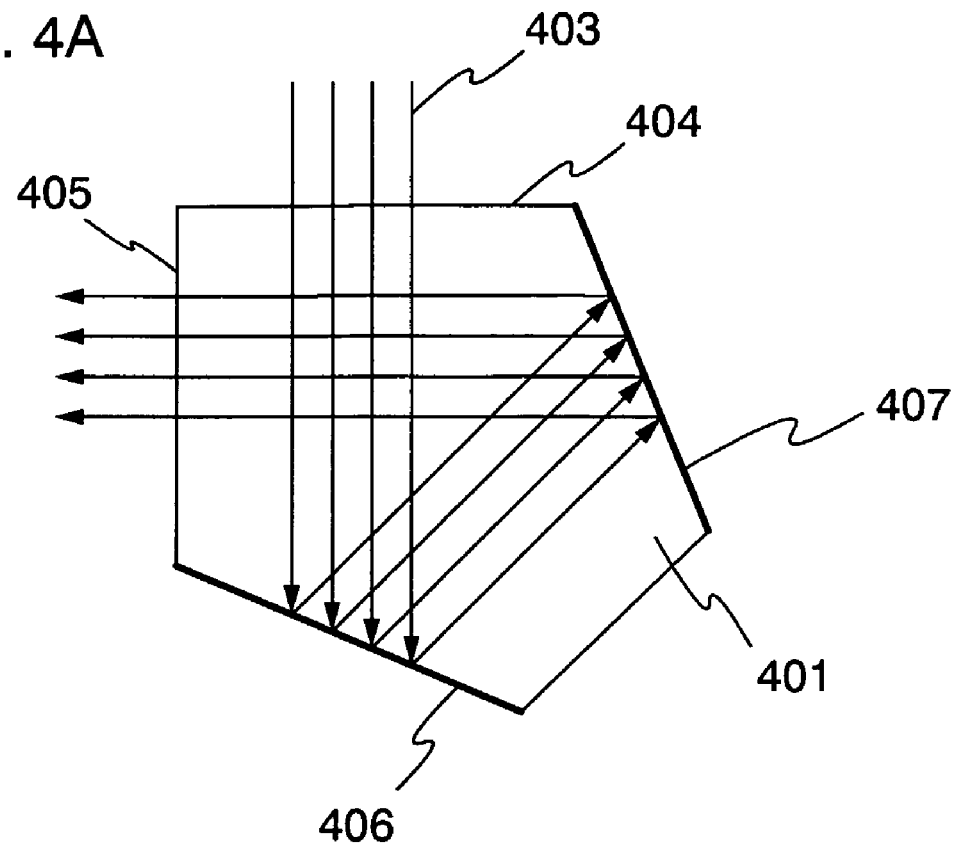
FIGS. 4A and 4B are diagrams each showing a mode of the beam homogenizer of the invention.
Figure 4B:
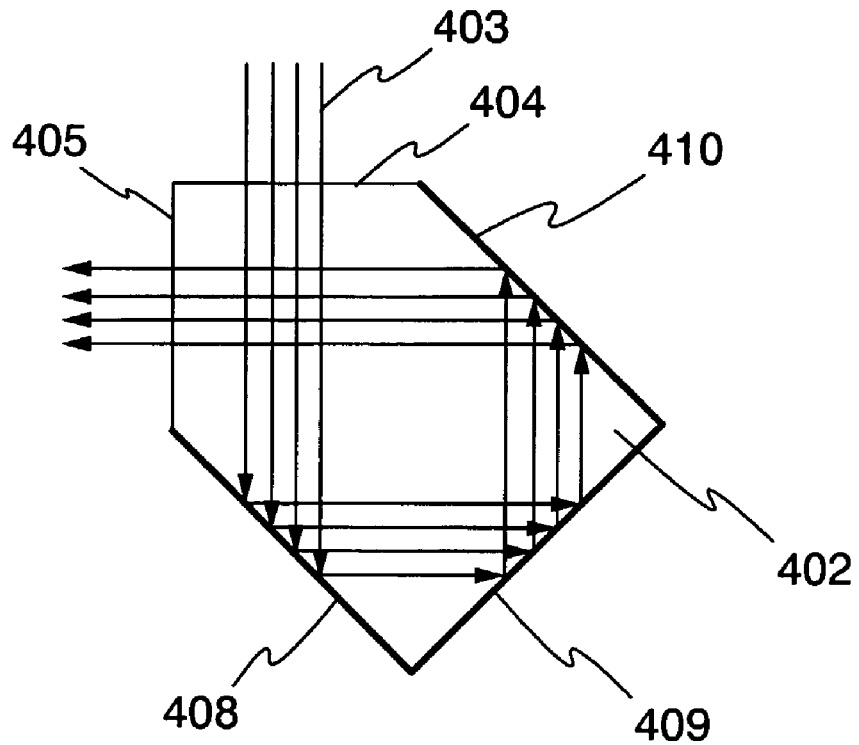

FIG. 4A shows a beam progression optical waveguide 401 having two beam course change reflection surfaces, and FIG. 4B shows a beam progression optical waveguide 402 having three course change reflection surfaces.

It is to be noted in FIGS. 4A and 4B that the distance a beam progresses from the entrance to the exit is the same in the beam progression optical waveguides 401 and 402.

In the beam progression optical waveguides 401 and 402, similarly to the beam progression optical waveguide 301, coating films 404 and 405 which transmit a laser beam 403 are provided at surfaces to which the laser beam 403 is entered and ejected respectively, and coating films 406 to 410 which reflect the laser beam 403 are provided at a plurality of course change reflection surfaces respectively.

By forming such coating films, the laser beam 403 is reflected more than once within the polygonal beam progression optical waveguide, thereby the laser beam is folded and the area of the beam progression optical waveguide can be reduced.

The beam progression optical waveguide has one or a plurality of course change reflection surfaces, and a part or all of the course change reflection surfaces can be used for changing the progression direction of the laser beam. The more the number of folding the laser beam by the course change reflection surface is, that is the more the number of course change reflection surfaces used for changing the progression direction of the laser beam is, the larger the area of the beam progression optical waveguide can be reduced.

Lastly, a mode of a beam homogenizer of the invention is described with reference to a plane schematic diagram of FIG. 5, in which two curved mirrors are used in a beam progression optical waveguide.

A beam progression optical waveguide 501 has course change reflection surfaces 502a and 502b which are concave or paraboloidal and reflect in the direction toward the entrance, and a course change reflection surface 503 which is convex or hyperboloidal and reflects in the direction toward the exit.

Figure 5:
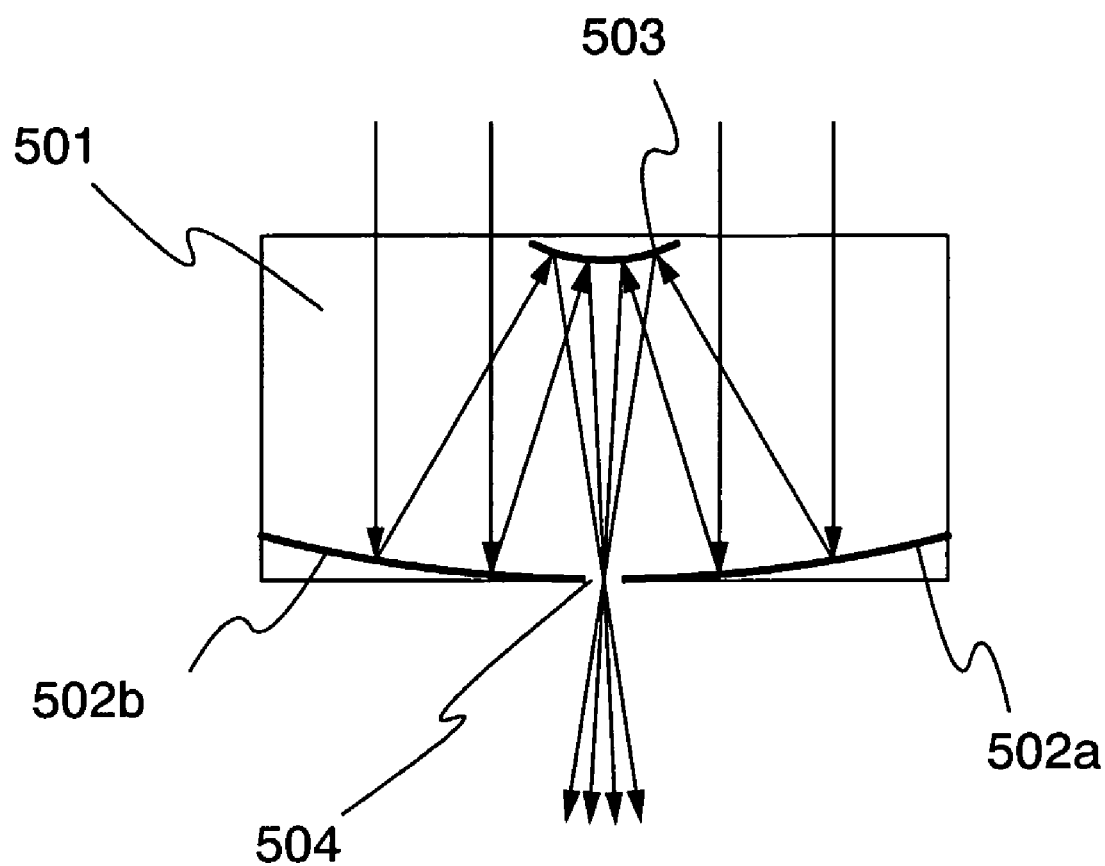
FIG. 5 is a diagram showing a mode of the beam homogenizer of the invention.

As shown in FIG. 5, the laser beam entered from the upper side in the drawing is reflected repeatedly at two light reflection surfaces which are provided in parallel so as to face each other, and then reflected at the course change reflection surfaces 502a and 502b so as to focus at the course change reflection surface 503.

Consequently, the laser beam focused at the course change reflection surface 503 is reflected toward an exit 504 which is provided between the course change reflection surfaces 502a and 502b to be led to ejection.

According to the beam progression optical waveguide 501, the intensity distribution of a laser beam is homogenized, and besides, the weight, the occupied area, and the material cost can be drastically reduced since a laser beam is folded into three within the beam progression optical waveguide by using the two course change reflection surfaces.

Embodiment Modes of Laser Irradiation Method and Apparatus of the Invention

Hereinafter, laser irradiation method and apparatus using a beam homogenizer in which the beam progression optical waveguide shown in FIGS. 1A and 1B is formed are described with reference to FIGS. 6A and 6B.

FIG. 6A is a top view and FIG. 6B is a side view.

First, description is made on the laser irradiation apparatus with reference to the side view of FIG. 6B.

A laser beam oscillated from a laser oscillator 601 progresses in the direction of an arrow in FIGS. 6A and 6B, and is magnified by cylindrical lenses 602a and 602b.

Note that this structure is not required in the case where the beam spot outputted from the laser oscillator 601 is sufficiently large.

Then, the laser beam is focused in the direction of the short side of a rectangle by a cylindrical lens 603. A beam homogenizer in which a beam progression optical waveguide 604 is formed having two light reflection surfaces which are provided in parallel so as to face each other (two light reflection surfaces facing each other) 604a and 604b, which is provided after the cylindrical lens 603, homogenizes the energy density distribution of the rectangular beam spot in the direction of the short side on an irradiation surface.

The homogenized beam passes through a mirror 605, cylindrical lens arrays 606a and 606b, and a cylindrical lens 607, and then magnified and demagnified by doublet cylindrical lenses 608a and 608b to be focused to be a rectangular ray of which the direction of the short side is the side shown in the side view, on an irradiation surface 609 which is provided after the doublet cylindrical lenses 608a and 608b.

Subsequently, description is made with reference to a top view of FIG. 6A.

A laser beam oscillated from the laser oscillator 601 is magnified by the cylindrical lenses 602a and 602b, enters the cylindrical lens 603 and the beam homogenizer in which the beam progression optical waveguide 604 is formed in this order. A laser beam ejected from the homogenizer is reflected by the mirror 605.

It is to be noted that the shape of a surface of the beam progression optical waveguide 604 along the progression direction of the beam is a triangle, and the beam entered the beam progression optical waveguide 604 is reflected at the hypotenuse thereof to change its progression direction by an angle of 90 degrees.

A beam spot of the beam of which course is changed is divided in the long side direction of a rectangle by the cylindrical lens arrays 606a and 606b, and enters the cylindrical lens 607, and the doublet cylindrical lenses 608a and 608b in this order. Then, the divided laser beams are combined on the irradiation surface 609.

Accordingly, the energy density distribution of the rectangular beam spot in the long direction can be homogenized and the length of the beam spot in the direction of the long side thereof is determined.

It is to be noted that in the laser irradiation apparatus shown in FIGS. 6A and 6B, the energy density distribution of a beam spot in the direction of the short side on the irradiation surface is homogenized first, and then distribution in the direction of the long side is homogenized; however, the energy density distribution in the direction of the long side may be performed first, and then that distribution in the direction of the short side may be performed.

In the latter case, specifically, the beam progression optical waveguide 604 that is a means for homogenizing in the direction of the short side and the cylindrical lens arrays 606a and 606b and the cylindrical lens 607 that are means for homogenizing in the direction of the long side are preferably changed for each other in FIGS. 6A and 6B. A laser irradiation apparatus shown in FIGS. 7A and 7B is obtained as a result of this change.

Note that in this case, the cylindrical lens 607 may be provided after the mirror 605.

For the laser oscillator to be combined with an optical system of the invention, it is preferable to use a laser oscillator which has high output power and emits the wavelength sufficiently absorbed in the semiconductor film.

When the semiconductor film is a silicon film, the wavelength of the laser beam emitted from the laser oscillator used is preferably 600 nm or shorter in consideration of the absorption ratio.

For example, an excimer laser, a YAG laser (harmonic), or a glass laser (harmonic) is used as the laser oscillator emitting such a laser beam.

Embodiment Modes of a Manufacturing Method of a Semiconductor Device of the Invention Described hereinafter is a manufacturing method of a semiconductor device of the invention using the beam homogenizer and the laser irradiation apparatus of the invention.

First, a substrate over which an amorphous silicon film is formed is prepared.

For example, the substrate is obtained by forming a silicon oxide film as a base film on a glass substrate and forming the amorphous silicon film thereon.

Next, laser irradiation is performed using the laser irradiation apparatus of the invention on the amorphous silicon film.

The laser beam irradiation is, for example, performed while scanning a stage on which the irradiation surface 609 shown in FIGS. 6A and 6B is mounted in the direction of the short side of the rectangular beam spot.

At that time, the energy density of the beam spot, the scanning interval of the beam, and the speed thereof on the irradiation surface can be arbitrarily determined. The laser annealing can be performed homogeneously when the scanning interval is selected in the range where the width of the rectangular beam spot in the direction in its short side is overlapped one another by about 90% or more.

The optimum scanning speed depends on the repetition rate of the laser oscillator, and it may be considered to be proportional to the repetition rate.

In this manner, a laser annealing step is completed.

By repeating the aforementioned step, a number of substrates can be processed.

Various semiconductor devices such as active-matrix liquid crystal displays can be manufactured by using this substrate and adding a desired known step.

Embodiment 1

Hereinafter, a manufacturing method of a semiconductor device of the invention using the laser irradiation method and the laser irradiation apparatus of the invention is described with reference to FIGS. 8A to 9C.

It is to be noted that, in addition to this embodiment, other modes applicable in the manufacturing process are also described hereinafter.

Figure 8A:
FIGS. 8A to 8D are diagrams showing a method for manufacturing a semiconductor device of the invention.

First, base insulating films 1101a and 1101b are formed on a substrate 1100 (FIG. 8A). A glass substrate is used as the substrate 1100 in this embodiment.

As a material of the substrate, an insulating substrate such as a glass substrate, a quartz substrate, and a crystalline glass substrate, a ceramic substrate, a stainless steel substrate, a metal substrate (such as tantalum, tungsten, and molybdenum), a semiconductor substrate, and a plastic substrate (such as polyimide, acrylic, polyethylene terephthalate, polycarbonate, polyarylate, and polyethersulfone) can be used; however, the material to be used is required to resist at least the heat generated in the process.

In this embodiment, a silicon nitride oxide film is formed with a thickness of 50 nm as the first base insulating film 1101a, and a silicon oxynitride film is formed with a thickness of 100 nm as the second base insulating film 1101b.

Alternatively, the base insulating films 1101a and 1101b formed on the substrate 1100 may be a silicon oxide film, a silicon nitride film, a silicon oxynitride film, or the like in a single-layer or multilayer structure.

These films are formed by a known method such as a sputtering method, a low-pressure CVD method, or a plasma CVD method.

As mentioned above, although the base insulating films are formed in a two-layer structure in this embodiment, the base insulating films may be formed in a single-layer structure or in a multilayer structure having three or more layers in the invention.

Note that the silicon nitride oxide film and the silicon oxynitride film are different in the proportion between nitrogen and oxygen, and the former contains more nitrogen than the latter does.

Next, an amorphous semiconductor film 1102 is formed.

In this embodiment, amorphous silicon is formed with a thickness of 66 nm by a CVD method.

It is to be noted that the amorphous semiconductor film is formed using silicon or a silicon-based material (e.g., $Si_xGe_{(1-x)}$) with a thickness of 25 to 80 nm.

As the manufacturing method thereof, a known method such as a sputtering method, a low-pressure CVD method, or a plasma CVD method can be employed.

Figure 8B:
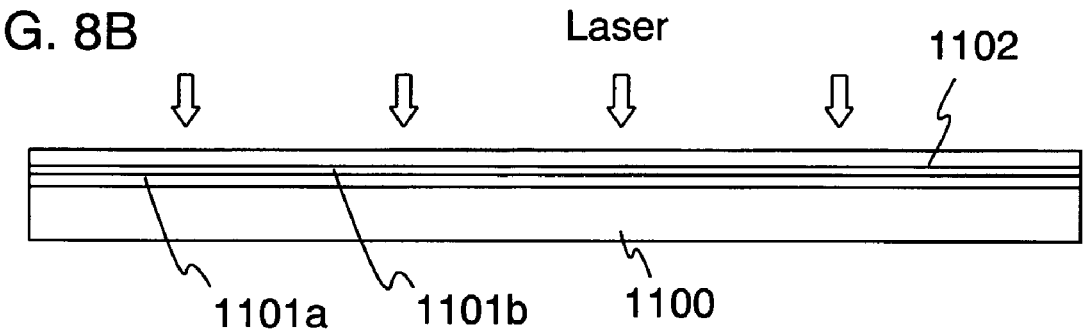

After forming the amorphous semiconductor film, crystallization of the amorphous silicon is performed (FIG. 8B).

The crystallization is, of course, performed by laser annealing using the beam homogenizer and the laser irradiation method and apparatus of the invention in this embodiment.

Therefore, with the beam homogenizer in which two light reflection surfaces are provided in a beam progression optical waveguide in parallel so as to face each other at surfaces along the progression direction of the beam and a course change reflection surface for changing the progression direction of the beam is formed at the surface in the direction intersected with the light reflection surfaces, a linear laser beam is homogenized in the direction of its short side, and then enters the cylindrical lens array or the like to be homogenized in the direction of its long side, and the homogenized laser beam is projected onto the amorphous semiconductor film to perform the laser annealing.

A crystalline semiconductor film obtained as a result of the crystallization by the annealing is etched to be desired shapes 1102a to 1102d.

Figure 8C:
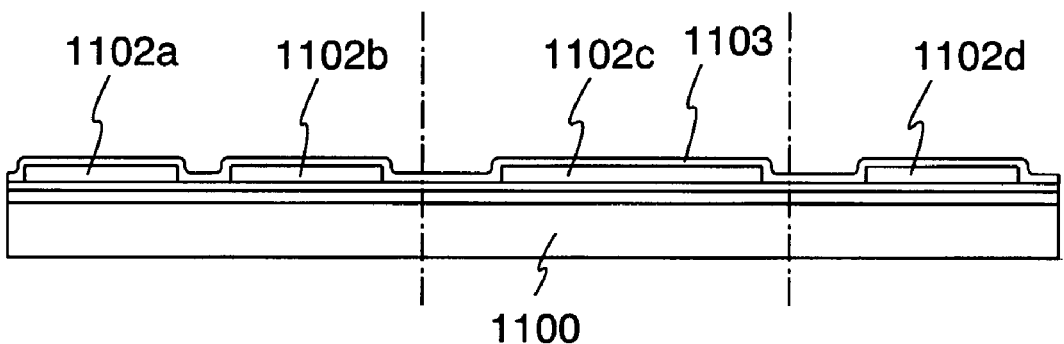

Subsequently, a gate insulating film 1103, which is a silicon oxide film in this embodiment, is formed (FIG. 8C).

The film thickness thereof is set at about 115 nm, and an insulating film containing silicon may be formed by a low-pressure CVD method, a plasma CVD method, a sputtering method, or the like.

Figure 8D:
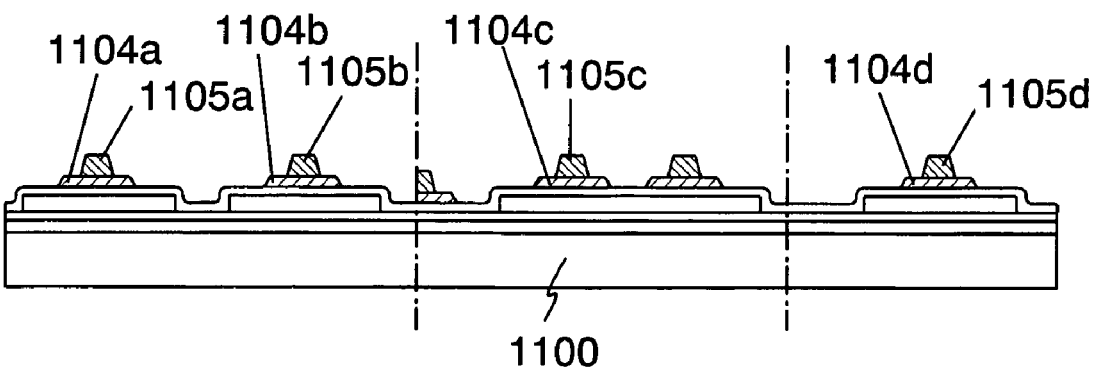

Next, tantalum nitride (TaN) is stacked with a thickness of 30 nm on the gate insulating film 1103 as first conductive layers 1104a to 1104d, and tungsten (W) is stacked with a thickness of 370 nm thereon as second conductive layers 1105a to 1105d (FIG. 8D).

The TaN film may be formed by a sputtering method using Ta as a target in an atmosphere of nitrogen, while the W film may be formed by a sputtering method using W as a target.

Although the first conductive layers 1104a to 1104d are formed using TaN with a thickness of 30 nm and the second conductive layers 1105a to 1105d are formed using W with a thickness of 370 nm in this embodiment, they are not limited to this. The first conductive layers 1104a to 1104d and the second conductive layers 1105a to 1105d may be formed using an element selected from Ta, W, Ti, Mo, Al, Cu, Cr and Nd, an alloy material or a compound material containing the above element as its main component.

In addition, a semiconductor film, typically a poly-crystalline silicon film doped with an impurity element such as phosphorus, may be also employed as the conductive layers. Alternatively, an AgPdCu alloy may be used. Furthermore, the combination of these may be selected arbitrarily.

The thickness of the first conductive layers 1104a to 1104d is preferably in the range of 20 to 100 nm, and that of the second conductive layers 1105a to 1105d is preferably in the range of 100 to 400 nm.

Although the two-layer structure is adopted in this embodiment as described above, such conductive layers may be formed in a single-layer structure or a multilayer structure having three or more layers.

Next, by using a gate electrode or a patterned resist as a mask, an impurity imparting n-type or p-type conductivity is selectively added in the semiconductor films 1102a to 1102d so that a source region, a drain region, an LDD region, and the like are formed.

Figure 9A:
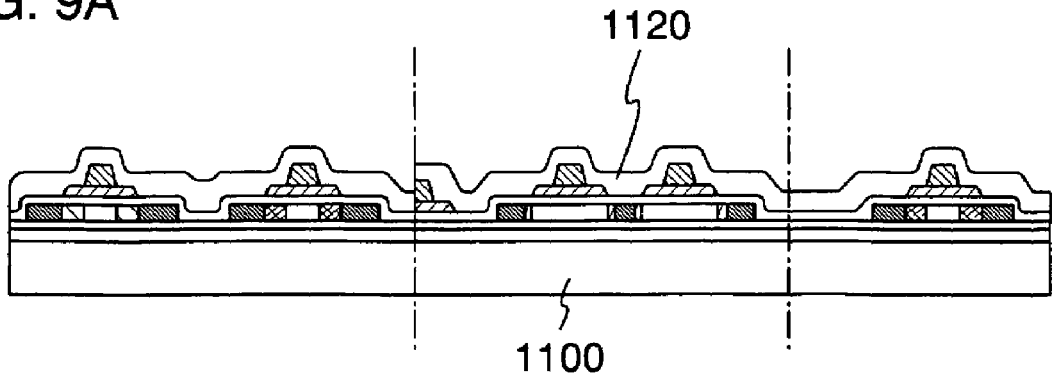
FIGS. 9A to 9C are diagrams showing a method for manufacturing the semiconductor device of the invention.

After that, the resist mask is removed, and a first passivation film 1120 is formed (FIG. 9A).

In this embodiment, a silicon oxynitride film is formed with a thickness of 100 nm by a plasma CVD method.

It is to be noted that an insulating film containing silicon may be formed as the first passivation film 1120 with a thickness of 100 to 200 nm.

A plasma CVD method or a sputtering method may be employed as the forming method thereof.

In this case, a silicon oxynitride film formed with $SiH_4$, $N_2O$, and $NH_3$ or a silicon oxynitride film formed with $SiH_4$ and $N_2O$ may be formed by a plasma CVD method.

These silicon oxynitride films are formed under a condition where the reaction pressure is in the range of 20 to 200 Pa, the substrate temperature is in the range of 300 to 400° C., and the electrical power density at high frequency (60 MHz) is in the range of 0.1 to 1.0 W/cm$^2$.

Alternatively, a silicon oxynitride hydride film formed with $SiH_4$, $N_2O$, and $H_2$ may be used as the first passivation film 1120.

It is needless to say that the first passivation film 1120 is not limited to the silicon oxynitride film in the single-layer structure as shown in this embodiment, and another insulating film containing silicon may be used in a single-layer or multilayer structure.

After that, laser annealing is performed to recover the crystallinity of the semiconductor layer and to activate the impurity element added in the semiconductor layer.

Similarly to the step of the crystallization, in this step, with the beam homogenizer in which two light reflection surfaces are provided in a beam progression optical waveguide in parallel so as to face each other at surfaces along the progression direction of the beam and a course change reflection surface for changing the progression direction of the beam is formed at the surface in the direction intersected with the light reflection surfaces, a linear laser beam can be homogenized in the direction of its short side, and then enter the cylindrical lens array or the like to be homogenized in the direction of its long side, and the homogenized laser beam can be projected in this embodiment.

Further, by performing heat treatment after the first passivation film 1120 is formed, hydrogenation of the semiconductor layer can be performed simultaneously with the activation treatment.

Dangling bonds in the semiconductor layer are terminated with hydrogen contained in the first passivation film 1120 due to this hydrogenation.

Alternatively, the heat treatment may be performed before the first passivation film 1120 is formed; in this case, the hydrogenation using hydrogen contained in the passivation film cannot be performed since the first passivation film 1120 is not formed yet.

However, when the materials of the first conductive layers 1104a to 1104d and the second conductive layers 1105a to 1105d are sensitive to heat, the heat treatment is preferably performed after the first passivation film 1120 is formed in order to protect wirings and the like as in this embodiment; in this case, the hydrogenation may be performed by using hydrogen excited in plasma (plasma hydrogenation) or by heat treatment in an atmosphere containing hydrogen by 3 to 100% at a temperature of 300 to 450° C. for 1 to 12 hours.

Figure 9B:
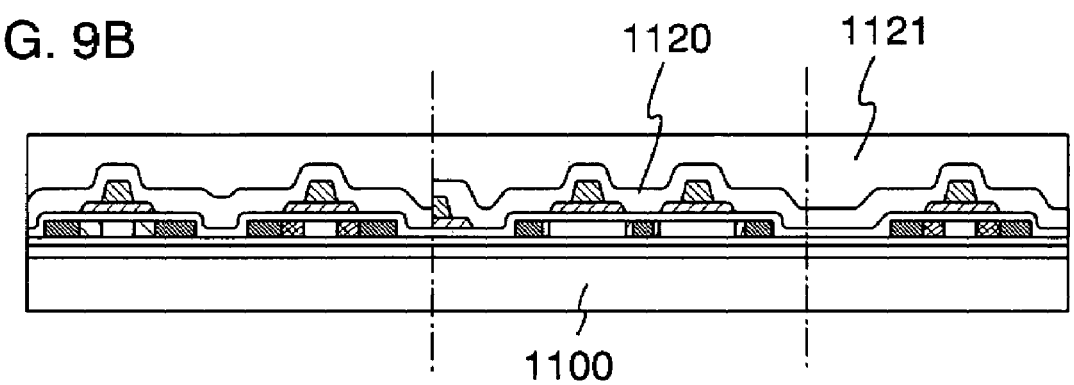

Next, a first interlayer insulating film 1121 is formed on the first passivation film 1120 (FIG. 9B).

A non-photosensitive acrylic film is formed with a thickness of 1.6 μm in this embodiment (FIG. 9B).

It is to be noted that an inorganic insulating film or an organic insulating film can be used as the first interlayer insulating film 1121.

As the inorganic insulating film, a silicon oxide film formed by a CVD method or a silicon oxide film applied by an SOG (Spin On Glass) method can be used. As the organic insulating film, a film of polyimide, polyamide, BCB (benzocyclobutene), acrylic, positive photosensitive organic resin, negative photosensitive organic resin, or the like can be used.

A multilayer structure of an acrylic film and a silicon oxynitride film may be used as well.

Furthermore, the first interlayer insulating film 1121 can be formed using a material whose skeleton structure is formed with a bond of silicon (Si) and oxygen (O) and which has a structure in which silicon is bonded with at least one of fluorine, aliphatic hydrocarbon, and aromatic hydrocarbon, which is typified by a siloxane-based polymer.

Siloxane-based polymers are classified by their structures into silica glass, an alkylsiloxane polymer, an alkylsilsesquioxane polymer, a silsesquioxane hydride polymer, an alkylsilsesquioxane hydride polymer, and the like.

Further, a material containing a polymer having a Si—N bond (polysilazane) may be used to form the first interlayer insulating film 1121.

By using the above-described material, the first interlayer insulating film 1121 can exhibit a sufficient insulating property and flatness even if it is formed so thinly.

Accordingly, depressions and projections due to the TFTs formed over the substrate can be relaxed and flattened by the first interlayer insulating film 1121. Since the first interlayer insulating film 1121 is provided particularly for the purpose of flattening, it is preferable to use an insulating film formed with a material easy to be flattened.

Moreover, since the above-described materials have high resistance against heat, an interlayer insulating film that can resist a reflow process in a multilayer wiring can be obtained.

Furthermore, since it has a low moisture-absorption property, an interlayer insulating film that has less dewatering volume can be formed.

After that, a second passivation film 1122 may be formed using a silicon nitride oxide film or the like on the first interlayer insulating film 1121; in this embodiment, a silicon oxynitride film is formed with a thickness of 70 nm by an RF sputtering method.

The thickness thereof is preferably in the range of about 10 to 200 nm, and the second passivation film 1122 can suppress moisture to be moved in and out of the first interlayer insulating film 1121.

As the second passivation film 1122, a silicon nitride film, an aluminum nitride film, an aluminum oxynitride film, a diamond-like carbon (DLC) film, or a carbon nitride (CN) film can be used similarly.

If the film is formed by an RF sputtering method, the density thereof is high and such a film is superior in the barrier property.

In the case of forming a silicon oxynitride film, for example, the RF sputtering is performed under a condition where Si is used as a target, $N_2$, Ar, and $N_2O$ are flowed at a gas flow ratio of 31:5:4, the pressure is 0.4 Pa, and the electric power is 3000 W.

In the case of forming a silicon nitride film alternatively, for example, Si is used as a target, $N_2$ and Ar are flowed at a gas flow ratio of 1:1 in the chamber, the pressure is 0.8 Pa, the electric power is 3000 W, and the film-forming temperature is 215° C.

Subsequently, the second passivation film 1122, the first interlayer insulating film 1121, and the first passivation film 1120 are etched to form contact holes to reach source and drain regions.

After that, wirings and electrodes 1123 to connect electrically to the respective source and drain regions are formed.

It is to be noted that the wirings and electrodes are formed by patterning a multilayer of a Ti film with a thickness of 50 nm and an alloy film (Al and Ti) with a thickness of 500 nm.

The invention is, of course, not limited to the two-layer structure and a single-layer structure or a multilayer structure having three or more layers may be employed.

In addition, the wiring material is not limited to Al and Ti.

For example, the wirings may be formed by patterning a multilayer in which an Al film or a Cu film is formed on a TaN film, and a Ti film is formed thereon.

Figure 9C:
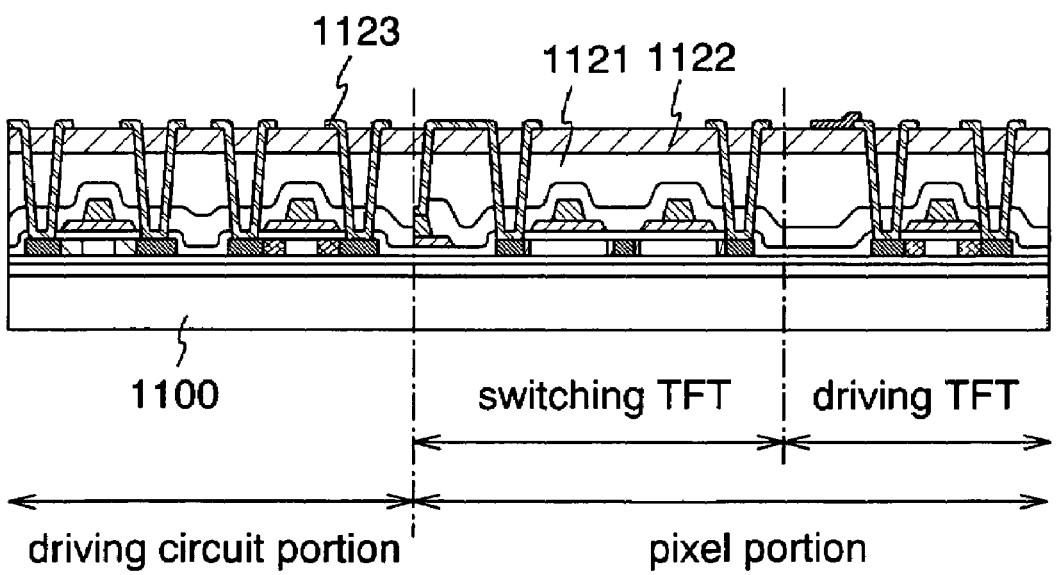

According to the above-described steps, a semiconductor device shown in FIG. 9C is completed.

It is to be noted that the manufacturing method of the semiconductor device using the laser irradiation method of the invention is not limited to the manufacturing steps of a TFT described above.

In addition, in the manufacturing method of the semiconductor device described in this embodiment, the beam homogenizer, the laser irradiation method and apparatus can be adopted by combining freely in the scope disclosed in the above embodiment modes.

Embodiment 2

Electronic devices incorporating the semiconductor device manufactured by the manufacturing method of the invention using the laser irradiation method of the invention include in its category a camera such as a video camera or a digital camera, a goggle-type display (a head-mounted display), a navigation system, a sound reproducing device (e.g., a car audio, an audio component system), a computer, a game machine, a portable information terminal (e.g., a mobile computer, a mobile phone, a portable game machine, or an electronic book), and an image reproducing device and the like provided with a recording medium (specifically, a DVD: Digital Versatile Disk) which reproduce the recording medium and have a display for displaying the image.

Specific examples of such electronic devices are shown in FIGS. 10A to 10H.

Figure 10A:
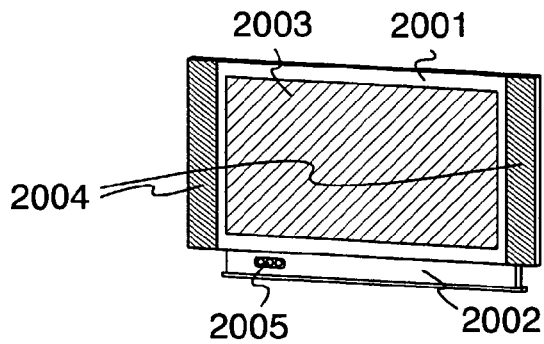
FIGS. 10A to 10H are views of electronic devices each incorporating a semiconductor device manufactured by the manufacturing method of a semiconductor device of the invention.

FIG. 10A shows a TV receiver including a housing 2001, a supporting base 2002, a display portion 2003, speaker portions 2004, a video input terminal 2005, and the like.

The TV receiver can be manufactured by using the semiconductor device manufactured using the laser irradiation method of the invention in the display portion 2003.

Figure 10B:
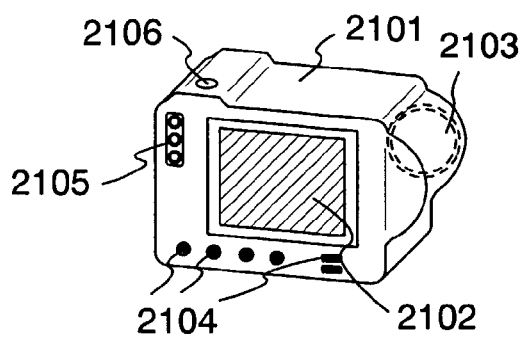

FIG. 10B shows a digital camera including a main body 2101, a display portion 2102, an image receiving portion 2103, operating keys 2104, an external connection port 2105, a shutter 2106, and the like.

The digital camera can be manufactured by using the semiconductor device manufactured using the laser irradiation method of the invention in the display portion 2102, a circuit or the like thereof.

Figure 10C:
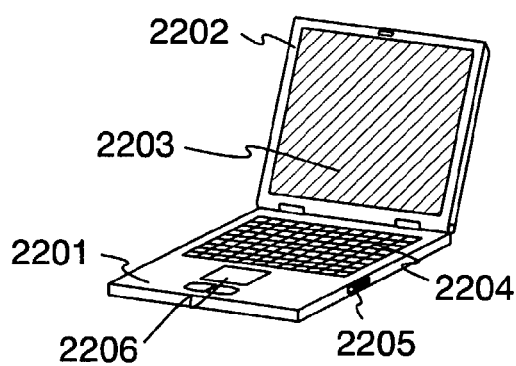

FIG. 10C shows a computer including a main body 2201, a housing 2202, a display portion 2203, a key board 2204, an external connection port 2205, a pointing mouse 2206, and the like.

The computer can be manufactured by using the semiconductor device manufactured using the laser irradiation method of the invention in the display portion 2203, a circuit or the like thereof.

That is, the laser irradiation method of the invention is employed for manufacturing the display portion 2203, the circuit or the like thereof in order to manufacture the computer.

Figure 10D:
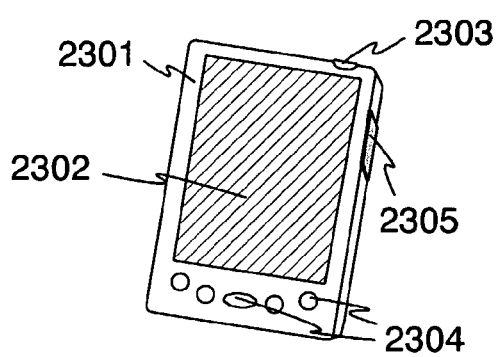

FIG. 10D shows a mobile computer including a main body 2301, a display portion 2302, a switch 2303, operating keys 2304, an infrared port 2305, and the like.

The mobile computer can be manufactured by employing the laser irradiation method of the invention for manufacturing the display portion 2302, a circuit or the like thereof.

Figure 10E:
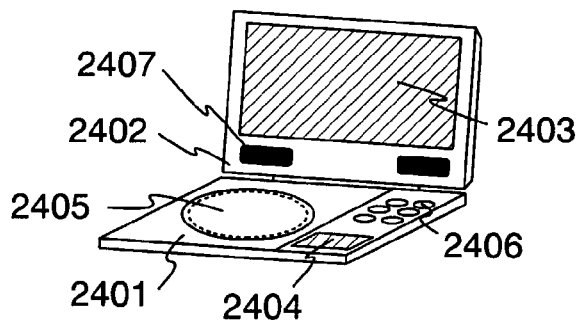

FIG. 10E shows a portable image reproducing device provided with a recording medium (e.g., a DVD reproducing device), which includes a main body 2401, a housing 2402, a display portion A 2403, a display portion B 2404, a recording medium (e.g., a DVD) reading portion 2405, an operating key 2406, a speaker portion 2407, and the like.

The display portion A 2403 mainly displays image data while the display portion B 2404 mainly displays character data.

The image reproducing device can be manufactured by employing the laser irradiation method of the invention for manufacturing the display portion A 2403, the display portion B 2404, a circuit or the like thereof.

Note that the image reproducing device provided with a recording medium includes in its category a game machine and the like.

Figure 10F:
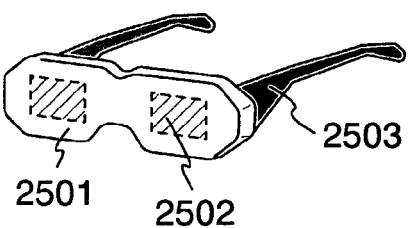

FIG. 10F shows a goggle-type display (a head-mounted display) including a main body 2501, a display portion 2502, and an arm portion 2503.

The goggle-type display can be manufactured by employing the laser irradiation method of the invention for manufacturing the display portion 2502, a circuit or the like thereof.

Figure 10G:
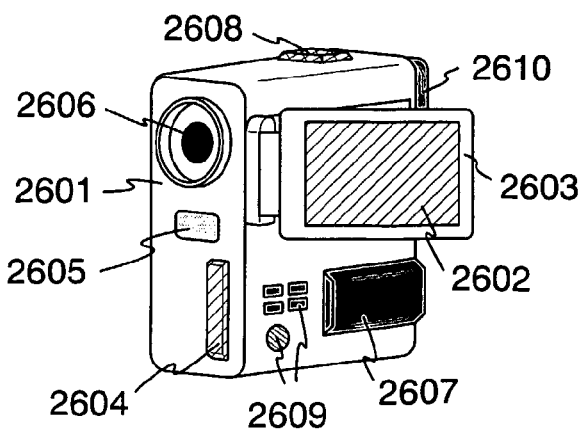

FIG. 10G shows a video camera including a main body 2601, a display portion 2602, a housing 2603, an external connection port 2604, a remote control receiving portion 2605, an image receiving portion 2606, a battery 2607, a sound input portion 2608, operating keys 2609, an eyepiece portion 2610, and the like.

The video camera can be manufactured by employing the laser irradiation method of the invention for manufacturing the display portion 2602, a circuit or the like thereof.

Figure 10H:
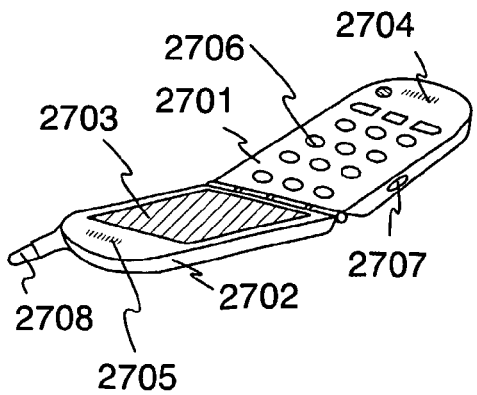

FIG. 10H shows a mobile phone including a main body 2701, a housing 2702, a display portion 2703, a sound input portion 2704, a sound output portion 2705, an operating key 2706, an external connection port 2707, an antenna 2708, and the like.

The mobile phone can be manufactured by employing the laser irradiation method of the invention for manufacturing the display portion 2703, a circuit or the like thereof.

It is to be noted that the invention can be applied to a front-type or rear-type projector as well as the above-described electronic devices.

As set forth above, the application range of the invention is quite long and the invention can be applied to electronic devices in various fields.

This application is based on Japanese Patent Application serial no. 2004-311919 filed in Japan Patent Office on 27 Oct. 2004, the entire contents of which are hereby incorporated by reference.

EXPLANATION OF REFERENCE

101: beam progression optical waveguide, 102: reflection surface, 103: laser beam, 201: beam progression optical waveguide, 202: laser beam, 203: entrance, 204: exit, 301: beam progression optical waveguide, 302: laser beam, 303: coating film which transmits laser beam, 304: coating film which reflects laser beam, 305: coating film which transmits laser beam, 401, 402: beam progression optical waveguide, 403: laser beam, 404, 405: coating film which transmits laser beam, 406 to 410: coating film which reflects laser beam, 501: beam progression optical waveguide, 502a, 502b: course change reflection surface, 503: course change reflection surface, 504: exit, 601: laser oscillator, 602a, 602b: cylindrical lens, 603: cylindrical lens, 604: two light reflection surfaces provided in parallel so as to face each other, 605: mirror, 606a, 606b: cylindrical lens array, 607: cylindrical lens, 608a, 608b: doublet cylindrical lens, 609: irradiation surface, 1100: substrate, 1101a, 1101b: base insulating film, 1102 (1102a to 1102d): amorphous semiconductor film, 1103: gate insulating film, 1104a to 1104d: first conductive layer, 1105a to 1105d: second conductive layer, 1120: first passivation film, 1121: first interlayer insulating film, 1122: second passivation film, 1123: wiring and electrode, 2001: housing, 2002: supporting base, 2003: display portion, 2004: speaker portion, 2005: video input terminal, 2101: main body, 2102: display portion, 2103: image receiving portion, 2104: operating key, 2105: external connection port, 2106: shutter, 2201: main body, 2202: housing, 2203: display portion, 2204: key board, 2205: external connection port, 2206: pointing mouse, 2301: main body, 2302: display portion, 2303: switch, 2304: operating key, 2305: infrared port, 2401: main body, 2402: housing, 2403: display portion A, 2404: display portion B, 2405: recording medium reading portion, 2406: operating key, 2407: speaker portion, 2501: main body, 2502: display portion, 2503: arm portion, 2601: main body, 2602: display portion, 2603: housing, 2604: external connection portion, 2605: remote control receiving portion, 2606: image receiving portion, 2607: battery, 2608: sound input portion, 2609: operating key, 2610: eyepiece portion, 2701: main body, 2702: housing, 2703: display portion, 2704: sound input portion, 2705: sound output portion, 2706: operating key, 2707: external connection port, 2708: antenna

The invention claimed is:

1. A beam homogenizer comprising:
   a beam progression optical waveguide comprising two light reflection surfaces; and
   at least one course change reflection surface between the two light reflection surfaces,
   wherein the two light reflection surfaces are provided in parallel,
   wherein a direction of a normal line of the two light reflection surfaces and a direction of a beam progression intersect each other at right-angles, and
   wherein two end portions of the course change reflection surface is provided in contact with the two light reflection surfaces respectively to change the direction of the beam progression.

2. The beam homogenizer according to claim 1, wherein the beam progression optical waveguide is a light-transmissive plate having a flat surface and a uniform thickness.

3. The beam homogenizer according to claim 1, wherein the beam progression optical waveguide comprises two mirrors provided in parallel, each mirror comprising a plate and a light-reflective film formed on the plate.

4. The beam homogenizer according to claim 1, wherein a shape of the light reflection surface of the beam progression optical waveguide is a right triangle, the course change reflection surface is formed at a hypotenuse thereof, and an entrance and an exit are formed at two sides other than the hypotenuse respectively.

5. The beam homogenizer according to claim 4, wherein the entrance and the exit are provided in a direction perpendicular to two sides other than the hypotenuse respectively.

6. The beam homogenizer according to claim 4, wherein at least one of the entrance and the exit has a linear shape.

7. The beam homogenizer according to claim 1, wherein a shape of the light reflection surface of the beam progression optical waveguide is a pentagon, an entrance and an exit are formed at adjacent sides respectively, and two course change reflection surfaces are formed at two sides adjacent to the two sides of the entrance and the exit respectively.

8. The beam homogenizer according to claim 7, wherein at least one of the entrance and the exit has a linear shape.

9. The beam homogenizer according to claim 1, wherein a shape of the light reflection surface of the beam progression optical waveguide is a pentagon, an entrance and an exit are formed at adjacent sides respectively, and three course change reflection surfaces are formed at all the sides other than the sides of the entrance and the exit respectively.

10. The beam homogenizer according to claim 9, wherein at least one of the entrance and the exit has a linear shape.

11. A laser irradiation apparatus comprising:
a beam homogenizer comprising a beam progression optical waveguide including two light reflection surfaces and a course change reflection surface between the two light reflection surfaces;
a cylindrical lens array;
a cylindrical lens; and
a stage,
wherein the two light reflection surfaces are provided in parallel,
wherein a direction of a normal line of the two light reflection surfaces and a direction of a beam progression intersect each other at right-angles,
wherein two end portions of the course change reflection surface is provided in contact with the two light reflection surfaces respectively to change the direction of the beam progression,
wherein the cylindrical lens array and the cylindrical lens homogenize energy density distribution in a direction of its long side by being entered the beam sequentially, and
wherein an irradiation surface onto which an irradiation beam having energy density distribution homogenized in both directions of its long and short sides is set on the stage.

12. The laser irradiation apparatus according to claim 11, wherein the beam progression optical waveguide is a light-transmissive plate having a flat surface and a uniform thickness.

13. The laser irradiation apparatus according to claim 11, wherein the beam progression optical waveguide comprises two mirrors provided in parallel, each mirror comprising a plate and a light-reflective film formed on the plate.

14. The laser irradiation apparatus according to claim 11, wherein a shape of the light reflection surface of the beam progression optical waveguide is a right triangle, the course change reflection surface is formed at a hypotenuse thereof, and an entrance and an exit are formed at two sides other than the hypotenuse respectively.

15. The laser irradiation apparatus according to claim 14, wherein the entrance and the exit are provided in a direction perpendicular to two sides other than the hypotenuse respectively.

16. The laser irradiation apparatus according to claim 14, wherein at least one of the entrance and the exit has a linear shape.

17. The laser irradiation apparatus according to claim 11, wherein a shape of the light reflection surface of the beam progression optical waveguide is a pentagon, an entrance and an exit are formed at adjacent sides respectively, and two course change reflection surfaces are formed at two sides adjacent to the two sides of the entrance and the exit respectively.

18. The laser irradiation apparatus according to claim 17, wherein at least one of the entrance and the exit has a linear shape.

19. The laser irradiation apparatus according to claim 11, wherein a shape of the light reflection surface of the beam progression optical waveguide is a pentagon, an entrance and an exit are formed at adjacent sides respectively, and three course change reflection surfaces are formed at all the sides other than the sides of the entrance and the exit respectively.

20. The laser irradiation apparatus according to claim 19, wherein at least one of the entrance and the exit has a linear shape.

21. A laser irradiation method comprising:
entering a first laser beam into a beam homogenizer comprising a beam progression optical waveguide including two light reflection surfaces and a course change reflection surface between the two light reflection surfaces to form a second laser beam having energy density distribution homogenized in a direction of its short side;
passing the second laser beam through a cylindrical lens array and a cylindrical lens sequentially to form a third laser beam having energy density distribution homogenized in a direction of its long side; and
irradiating the third laser beam onto an irradiation surface;
wherein the two light reflection surfaces are provided in parallel,
wherein a direction of a normal line of the two light reflection surfaces and a direction of a beam progression intersect each other at right-angles, and
wherein two end portions of the course change reflection surface is provided in contact with the two light reflection surfaces respectively to change the direction of the beam progression.

22. The laser irradiation method according to claim 21, wherein the beam progression optical waveguide is a light-transmissive plate having a flat surface and a uniform thickness.

23. The laser irradiation method according to claim 21, wherein the beam progression optical waveguide comprises two mirrors provided in parallel, each mirror comprising a plate and a light-reflective film formed on the plate.

24. The laser irradiation method according to claim 21, wherein a shape of the light reflection surface of the beam progression optical waveguide is a right triangle, the course change reflection surface is formed at a hypotenuse thereof, and an entrance and an exit are formed at two sides other than the hypotenuse respectively.

25. The laser irradiation method according to claim 24, wherein the entrance and the exit are provided in a direction perpendicular to two sides other than the hypotenuse respectively.

26. The laser irradiation method according to claim 24, wherein at least one of the entrance and the exit has a linear shape.

27. The laser irradiation method according to claim 21, wherein a shape of the light reflection surface of the beam progression optical waveguide is a pentagon, an entrance and an exit are formed at adjacent sides respectively, and two course change reflection surfaces are formed at two sides adjacent to the two sides of the entrance and the exit respectively.

28. The laser irradiation method according to claim 27, wherein at least one of the entrance and the exit has a linear shape.

29. The laser irradiation method according to claim 21, wherein a shape of the light reflection surface of the beam progression optical waveguide is a pentagon, an entrance and an exit are formed at adjacent sides respectively, and three course change reflection surfaces are formed at all the sides other than the sides of the entrance and the exit respectively.

30. The laser irradiation method according to claim 29, wherein at least one of the entrance and the exit has a linear shape.

31. The laser irradiation method according to claim 21, wherein the irradiation surface is a non-single crystalline semiconductor film over a substrate.

32. A laser annealing method comprising:
    entering a first laser beam into a beam homogenizer comprising a beam progression optical waveguide including two light reflection surfaces and a course change reflection surface between the two light reflection surfaces to form a second laser beam having energy density distribution homogenized in a direction of its short side;
    passing the second laser beam through a cylindrical lens array and a cylindrical lens sequentially to form a third laser beam having energy density distribution homogenized in a direction of its long side; and
    irradiating the third laser beam onto an irradiation surface;
    wherein the two light reflection surfaces are provided in parallel,
    wherein a direction of a normal line of the two light reflection surfaces and a direction of a beam progression intersect each other at right-angles, and
    wherein two end portions of the course change reflection surface is provided in contact with the two light reflection surfaces respectively to change the direction of the beam progression.

33. The laser annealing method according to claim 32, wherein the beam progression optical waveguide is a light-transmissive plate having a flat surface and a uniform thickness.

34. The laser annealing method according to claim 32, wherein the beam progression optical waveguide comprises two mirrors provided in parallel, each mirror comprising a plate and a light-reflective film formed on the plate.

35. The laser annealing method according to claim 32, wherein a shape of the light reflection surface of the beam progression optical waveguide is a right triangle, the course change reflection surface is formed at a hypotenuse thereof, and an entrance and an exit are formed at two sides other than the hypotenuse respectively.

36. The laser annealing method according to claim 35, wherein the entrance and the exit are provided in a direction perpendicular to two sides other than the hypotenuse respectively.

37. The laser annealing method according to claim 35, wherein at least one of the entrance and the exit has a linear shape.

38. The laser annealing method according to claim 32, wherein a shape of the light reflection surface of the beam progression optical waveguide is a pentagon, an entrance and an exit are formed at adjacent sides respectively, and two course change reflection surfaces are formed at two sides adjacent to the two sides of the entrance and the exit respectively.

39. The laser annealing method according to claim 38, wherein at least one of the entrance and the exit has a linear shape.

40. The laser annealing method according to claim 32, wherein a shape of the light reflection surface of the beam progression optical waveguide is a pentagon, an entrance and an exit are formed at adjacent sides respectively, and three course change reflection surfaces are formed at all the sides other than the sides of the entrance and the exit respectively.

41. The laser annealing method according to claim 40, wherein at least one of the entrance and the exit has a linear shape.

42. The laser annealing method according to claim 32, wherein the irradiation surface is a non-single crystalline semiconductor film over a substrate.

43. A method for manufacturing a semiconductor device comprising:
    forming a semiconductor film over a substrate;
    homogenizing a laser beam by a beam homogenizer comprising a beam progression optical waveguide including two light reflection surfaces and at least one course change reflection surface between the two light reflection surfaces, a cylindrical lens array and a cylindrical lens; and
    irradiating the homogenized laser beam to the semiconductor film to crystallize the semiconductor film;
    wherein the two light reflection surfaces provided in parallel,
    wherein a direction of a normal line of the two light reflection surfaces and a direction of a beam progression intersect each other at right-angles, and
    wherein two end portions of the course change reflection surface is provided in contact with the two light reflection surfaces respectively to change the direction of the beam progression.

44. The method for manufacturing a semiconductor device according to claim 43, wherein the beam progression optical waveguide is a light-transmissive plate having a flat surface and a uniform thickness.

45. The method for manufacturing a semiconductor device according to claim 43, wherein the beam progression optical waveguide comprises two mirrors provided in parallel, each mirror comprising a plate and a light-reflective film formed on the plate.

46. The method for manufacturing a semiconductor device according to claim 43, wherein a shape of the light reflection surface of the beam progression optical waveguide is a right triangle, the course change reflection surface is formed at a hypotenuse thereof, and an entrance and an exit are formed at two sides other than the hypotenuse respectively.

47. The method for manufacturing a semiconductor device according to claim 46, wherein the entrance and the exit are provided in a direction perpendicular to two sides other than the hypotenuse respectively.

48. The method for manufacturing a semiconductor device according to claim 46, wherein at least one of the entrance and the exit has a linear shape.

49. The method for manufacturing a semiconductor device according to claim 43, wherein a shape of the light reflection surface of the beam progression optical waveguide is a pentagon, an entrance and an exit are formed at adjacent sides respectively, and two course change reflection surfaces are formed at two sides adjacent to the two sides of the entrance and the exit respectively.

50. The method for manufacturing a semiconductor device according to claim 49, wherein at least one of the entrance and the exit has a linear shape.

51. The method for manufacturing a semiconductor device according to claim 43, wherein a shape of the light reflection surface of the beam progression optical waveguide is a pentagon, an entrance and an exit are formed at adjacent sides respectively, and three course change reflection surfaces are formed at all the sides other than the sides of the entrance and the exit respectively.

52. The method for manufacturing a semiconductor device according to claim 51, wherein at least one of the entrance and the exit has a linear shape.

* * * * *